United States Patent
Zhou et al.

(10) Patent No.: US 9,230,772 B2
(45) Date of Patent: Jan. 5, 2016

(54) DEVICE AND METHOD FOR ION GENERATION

(75) Inventors: Zilu Zhou, Needham, MA (US); Joyce Wong, Pasadena, CA (US)

(73) Assignee: Schlumberger Technology Corporation, Sugar Land, TX (US)

( * ) Notice: Subject to any disclaimer, the term of this patent is extended or adjusted under 35 U.S.C. 154(b) by 882 days.

(21) Appl. No.: 13/338,702

(22) Filed: Dec. 28, 2011

(65) Prior Publication Data

US 2013/0170592 A1    Jul. 4, 2013

(51) Int. Cl.
| | |
|---|---|
| *H01J 27/02* | (2006.01) |
| *H01J 37/08* | (2006.01) |
| *H05H 3/06* | (2006.01) |
| *H01J 1/304* | (2006.01) |
| *G21G 4/02* | (2006.01) |
| *H01J 35/06* | (2006.01) |

(52) U.S. Cl.
CPC ............... *H01J 27/02* (2013.01); *H01J 1/3044* (2013.01); *G21G 4/02* (2013.01); *H01J 35/065* (2013.01); *H01J 37/08* (2013.01); *H05H 3/06* (2013.01)

(58) Field of Classification Search
CPC ........... H01J 1/30; H01J 1/304; H01J 1/3042; H01J 1/3044; H01J 27/20; H01J 27/205; H01J 37/073; H01J 37/08; H01J 49/147; H01J 2201/30434; H01J 2201/30469; H01J 2237/0802
USPC ....................................................... 250/427
See application file for complete search history.

(56) References Cited

U.S. PATENT DOCUMENTS

| | | | |
|---|---|---|---|
| 4,272,699 A * | 6/1981 | Faubel et al. | ............... 313/360.1 |
| 4,600,838 A | 7/1986 | Steinman et al. | |
| 4,721,853 A | 1/1988 | Wraight | |
| 4,794,792 A | 1/1989 | Flaum et al. | |
| 5,313,504 A | 5/1994 | Czirr | |
| 6,080,985 A * | 6/2000 | Welkie et al. | ................. 250/287 |
| 2009/0135982 A1 | 5/2009 | Groves | |
| 2009/0283693 A1 * | 11/2009 | Hsu et al. | ................... 250/423 F |
| 2011/0180698 A1 | 7/2011 | Stephenson | |

OTHER PUBLICATIONS

Lahiri et al. Ultra-high current density carbon nanotube field emitter structure on three-dimensional micro-channeled copper; Applied Physics Letters 101, 063110 (2012) 1-5.
Lahiri et al. Enhanced field emission from multi-walled carbon nanotubes grown on pure copper substrate; Carbon 48 (2012) pp. 1531-1538.
Csikai, J., CRC Handbook of Fast Neutron Generators vol. 1 (1930) Chapter 1, pp. 3-44.
Seelaboyina et al. Enhanced field emission from aligned multistage carbon nanotube emitter arrays; Nanotechnology 19 (2008) pp. 1-4.

(Continued)

*Primary Examiner* — Jack Berman

(57) ABSTRACT

Illustrative embodiments of the present invention are directed to devices and methods for ion generation. One such device includes a substrate. The substrate is disposed within a housing that is configured to contain a gas. The substrate includes an interior surface that at least partially defines an interior volume. The substrate also includes a number of channels with walls. Nano-tips are disposed on the walls of the channels.

17 Claims, 10 Drawing Sheets

(56) References Cited

OTHER PUBLICATIONS

Seelaboyina et al. Enhanced field emission from aligned multistage carbon nanotube emitter arrays; Nanotechnology 19 (2008) pp. 1-4.
Carbon-nanotube-embedded novel three-dimensional alumina microchannel cold cathodes for high electron emission; Nanotechnology 21 (2010) pp. 1-7.
Wolf, B., Handbook of Ion Sources, GSI Center for Heavy Ion Research (1939) Chapter 1, pp. 1-35.
Calderon-Colon et al., A carbon nanotube field emission cathode with high current density and long-term stability; Nanotechnology 20 (2009) pp. 1-5.

* cited by examiner

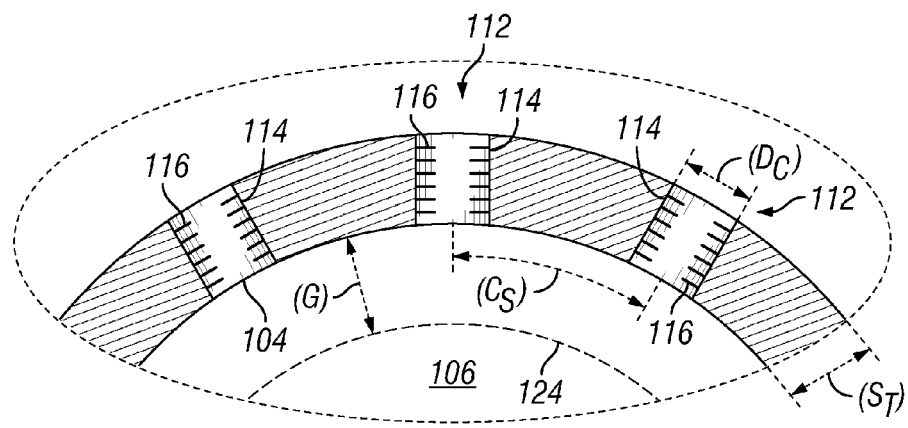
FIG. 3
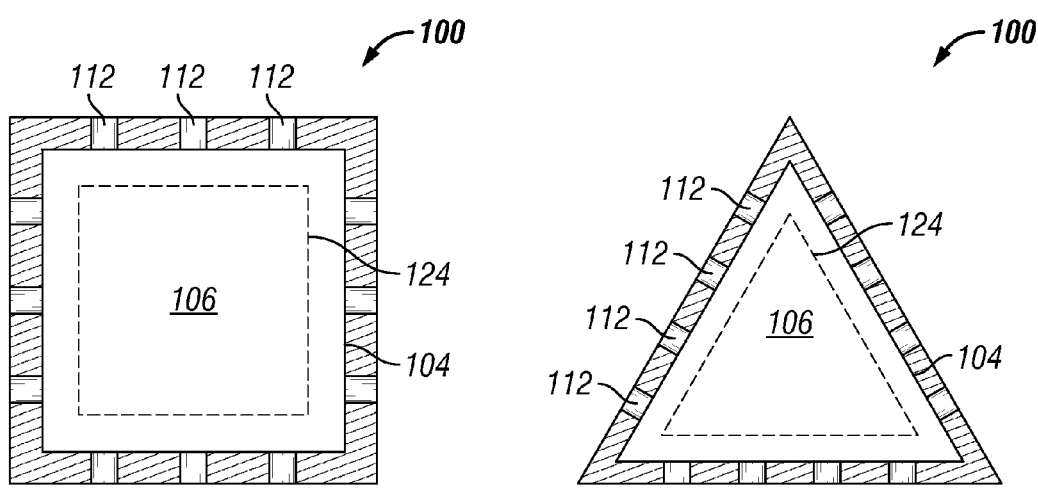
FIG. 4  FIG. 5

DEVICE AND METHOD FOR ION GENERATION

TECHNICAL FIELD

This invention relates to ion generation and more particularly to devices and methods for ion generation.

BACKGROUND

Neutron generators are used in oil and gas field tools for a variety of different applications. Neutron generators use electronic neutron sources to generate neutrons. In some cases, neutron generators are used as alternatives to chemical neutron sources. Electronic neutron generators have several advantages over chemical neutron sources. For example, electronic neutron generators can be switched on and off, have higher neutron output, and have the capability of pulsed operation.

To generate neutrons, electronic neutron generators use an ion source, an accelerating structure, and a target. In conventional neutron generators, the ion source includes a cathode. The cathode is brought to high temperature so that it emits electrons. The electrons are then used to ionize a gas. The gaseous ions are accelerated by the accelerating structure towards the target. When the ions strike the target, neutrons are produced through nuclear reactions, such as the following fusion reaction: $^3H + ^2H = n + ^4He + 14.1$ MeV.

Such conventional "hot cathode" ion sources, however, are difficult to use in oil and gas field tools because they require operation at very high temperatures. Accordingly, hot cathode ion sources have high power requirements. Furthermore, problems with high temperature operation are compounded because neutron generators can use electrical insulation, which impedes heat flow and magnifies high temperatures within the neutron generator. In one example, insulation is used to insulate a high voltage system that powers the accelerator. Such magnified high temperatures can adversely affect the performance and lifetimes of components within the neutron generator.

SUMMARY

Illustrative embodiments are directed to devices and methods for ion generation. In one embodiment, such an ion source includes a substrate (or substrates). The substrate includes an interior surface that at least partially defines an interior volume. The substrate also includes a number of channels with walls. Nano-tips are disposed on the walls of the channels.

In some embodiments, the device also includes a grid that is spaced from the substrate and a circuit that applies a potential between the grid and the substrate.

Illustrative embodiments are also directed to methods for ion generation. When a potential is applied between the grid and the substrate, the ion source generates ions from a gas. The ions are concentrated within the interior volume. In some embodiments, the potential is applied so that the nano-tips extract electrons from gaseous molecules to form ions. In another embodiment, the potential is applied so that the nano-tips emit electrons that interact with gaseous molecules to form ions.

Illustrative embodiments are also directed to neutron generators. In one embodiment, a neutron generator includes an ion source. The ion source includes a substrate (or substrates) with an interior surface that at least partially defines an interior volume. The substrate also includes a number of channels with walls. Nano-tips are disposed on the walls of the channels. A grid is spaced from the substrate. A circuit applies a potential between the grid and the substrate. The neutron generator also includes a target and an accelerator section that is configured to accelerate ions from the ion source towards the target and to strike the ions against the target to generate neutrons. The neutron generator further includes a housing that is configured to contain a gas (e.g., gas mixture). The ion source, target, and accelerator section are disposed within the housing.

Illustrative embodiments are also directed to methods for neutron generation. In various embodiments, a potential is applied between the grid and the substrate. In this manner, the ion source generates ions from the gas. The ions are concentrated within the interior volume. The accelerator section extracts the ions from the interior volume and accelerates the ions towards the target. When the ions strike the target, neutrons are generated.

BRIEF DESCRIPTION OF THE DRAWINGS

Those skilled in the art should more fully appreciate advantages of various embodiments of the disclosure from the following "Description of Illustrative Embodiments," discussed with reference to the drawings summarized immediately below:

FIG. 3 shows a schematic representation, in detail, of the of the ion source of FIG. 1, in accordance with one embodiment of the present disclosure;

FIG. 4 shows a schematic representation, in cross section, of an ion source with a rectangular substrate in accordance with one embodiment of the present disclosure;

FIG. 5 shows a schematic representation, in cross section, of an ion source with a triangular substrate in accordance with one embodiment of the present disclosure;

DESCRIPTION OF ILLUSTRATIVE EMBODIMENTS

Illustrative embodiments of the invention are directed to methods and devices for ion generation that function at lower temperatures and use less power than conventional "hot cathode" ion sources. To this end, various embodiments of the invention use a plurality of nano-tips to generate gaseous ions. Furthermore, illustrative embodiments of the invention include a substrate with a surface that at least partially defines an interior volume. The gaseous ions are concentrated within the interior volume. In this manner, various embodiments of the invention provide for improved ion control. Details of various embodiments are discussed below.

Figure 1:
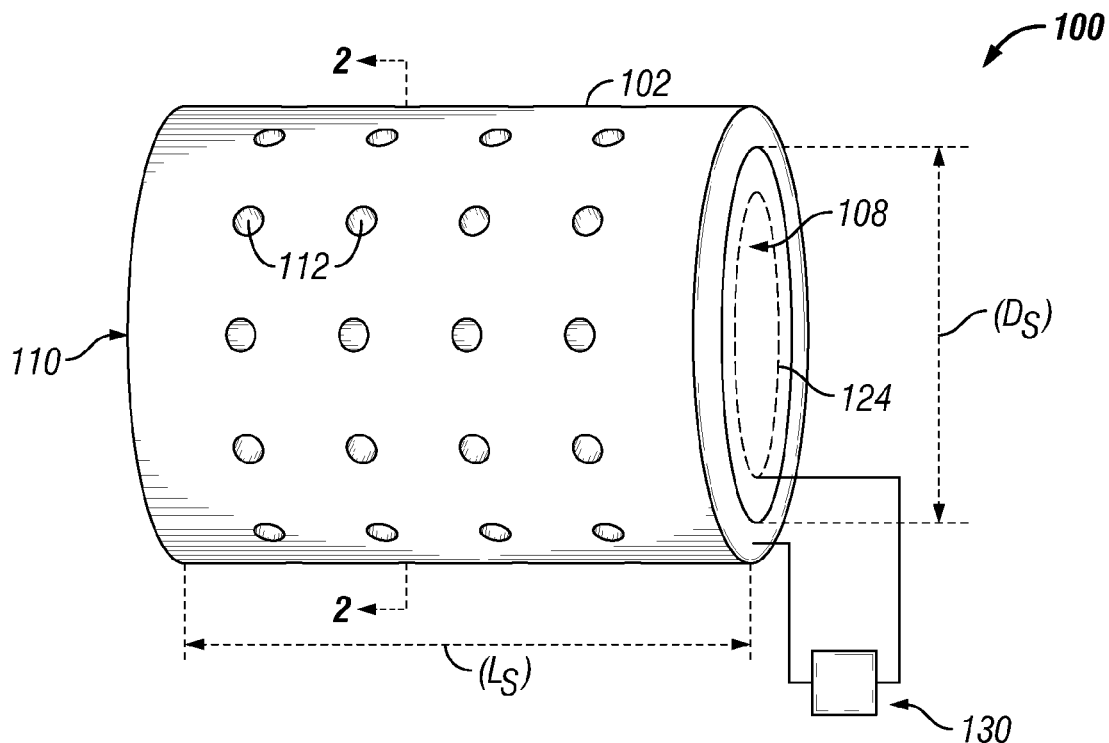
FIG. 1 shows a schematic representation of an ion source in accordance with one embodiment of the present disclosure.
Figure 2:
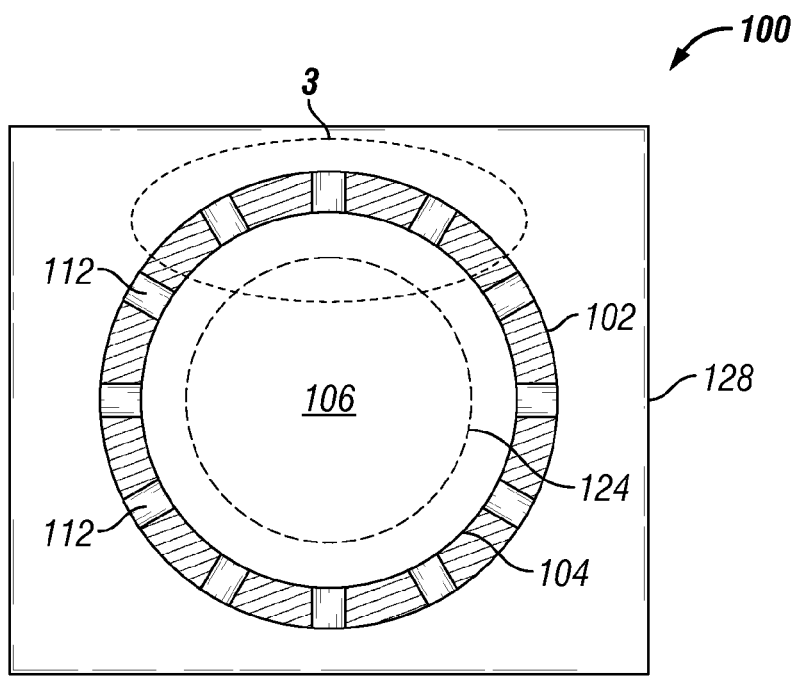
FIG. 2 shows a schematic representation, in cross section, of the ion source of FIG. 1, in accordance with one embodiment of the present disclosure.

FIGS. 1, 2 and 3 show an ion source 100 in accordance with one embodiment of the present invention. The ion source includes a substrate 102 with a surface 104 that at least partially defines an interior volume 106. An interior volume 106 is a volume that is physically bound by at least two different planes. For example, in the embodiment of FIGS. 1 and 2, the substrate 102 forms a cylindrical tube with an interior surface 104. In this case, the interior surface 104 defines an infinite number of planes that bound the interior volume 106. The interior volume 106 is partially bound because the tube includes a first opening 108 and a second opening 110. In the specific embodiment of FIGS. 1-3, the cylindrical substrate 102 has an inner diameter ($D_S$) of approximately 1 cm-5 cm and a length ($L_S$) of 1 cm-5 cm. It should be noted that discussion of the relative thicknesses, dimensions, and sizes is illustrative and not intended to limit the scope of the invention.

Figure 6:
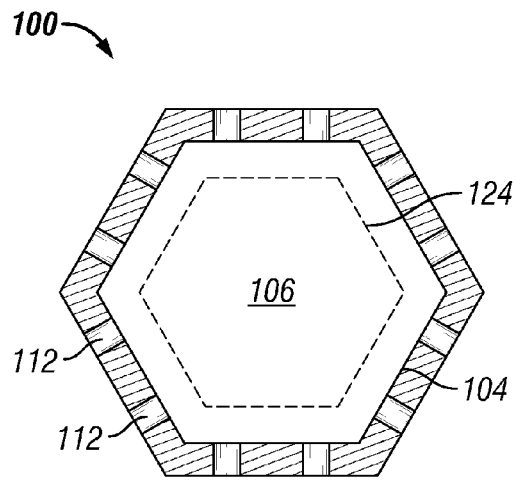
FIG. 6 shows a schematic representation, in cross section, of an ion source with a hexagonal substrate in accordance with one embodiment of the present disclosure.
Figure 7:
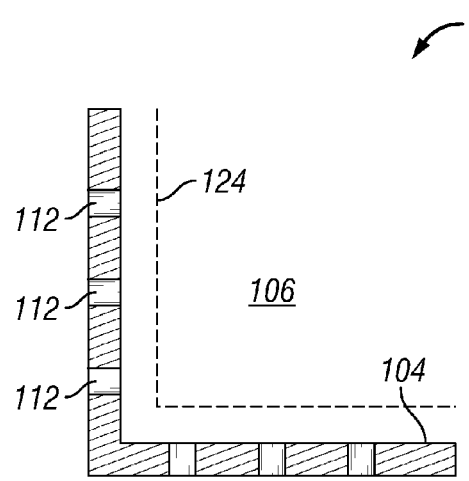
FIG. 7 shows a schematic representation, in cross section, of an ion source with an angled substrate in accordance with one embodiment of the present disclosure.

FIGS. 4, 5, 6, 7, 8 and 9 provide other examples of substrates 102 in accordance with various embodiments of the present invention. In FIG. 4, the substrate 102 is a rectangular tube and the interior surface 104 defines four different planes that bound the interior volume 106. In FIG. 5, the substrate 102 forms a triangular tube and the interior surface 104 defines three different planes that bound the interior volume 106. In FIG. 6, the substrate 102 forms a hexagonal tube and the interior surface 104 defines six different planes that bound the interior volume 106. Illustrative embodiments of the present invention are not limited to tube structures. FIG. 7 shows a substrate that is angled. In this case, the substrate 102 has an interior surface 104 that defines two different planes that bound the interior volume 106.

In some embodiments, the tubular substrates and angled substrates 102 of the present invention are formed from a single member by, for example, bending a substrate member into a tubular or angled shape. In various other embodiments, the substrate 102 is grown from a substrate melt in a tubular shape or angled shape. In another embodiment, the substrate 102 is machined into tubular shapes and angled shapes from a bulk quantity of substrate material. In yet another embodiment, the tubular shapes and angled shapes are formed by mechanically coupling a number of separate substrate members using an adhesive and/or bonding process (e.g., gluing, welding and/or brazing).

Illustrative embodiments of the present invention are also not limited to a single substrate 102. A plurality of substrates could also be used to define the interior volume 106. For example, in FIGS. 8 and 9, the ion source includes two substrates 102, 103 that are spaced from each other. The interior surfaces 104, 105 of each of the substrates define two planes that bound the interior volume 106.

As shown in FIGS. 1-9, the substrate 102 includes a plurality of channels 112. In the embodiment of FIG. 1, the channels 112 are circular, however, in other embodiments, the channels can have other shapes. For example, the channels 112 can be rectangular with extended lengths (in relation to their widths).

The channels 112 are shown in further detail in FIG. 2, which shows a cross section of the ion source 100 in FIG. 1. As shown in FIG. 2, the channels 112 extend through the entire substrate 102 to form through-holes. In various other embodiments of the invention, the channels 112 do not form through-holes and instead form holes that extend partially through the substrate 102.

FIG. 3 provides an even more detailed view of the channels 112. As shown in FIG. 3, the channels 112 include walls 114 that are disposed with a plurality of nano-tips 116. In some embodiments, the nano-tips 116 are spaced from each other and create a bundle of nano-tips that extend from the walls 114 of the channel 116 (e.g., an array of nano-tips). In the specific embodiment of FIG. 3, each channel has a diameter ($D_C$) of approximately 250 μm. Also, the substrate has a thickness ($S_T$) of approximately 500 μm and the channels are spaced less than approximately 500 μm from one another ($C_S$). Various embodiments of the present invention are not limited to these dimensions. For example, in further illustrative embodiments, the diameter ($D_C$) of each channel 112 is in the range of 100 μm-500 μm, the thickness ($S_T$) of the substrate is in the range of 100 μm-1000 μm, and the spacing ($C_S$) between the channels is in the range of 100 μm-1000 μm.

In various embodiments, the ion source 100 also includes a grid 124 that is spaced from the substrate 102. The grid 124 is configured to create an electrical potential across a certain area over the substrate 102. To this end, in one example, the grid 124 is composed from a plurality conductive wires that form a two-dimensional pattern (e.g., a mesh or netted material). In additional or alternative embodiments, the grid 124 is a conductive plate and/or an electrode. The grid 124 can be formed from conductive materials such as stainless steel, nickel or molybdenum.

Figure 8:
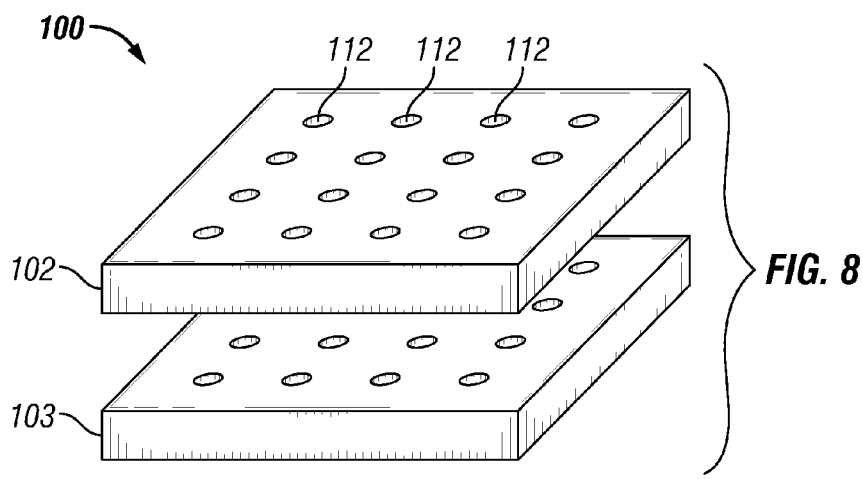
FIG. 8 shows a schematic representation of an ion source with a plurality of substrates in accordance with one embodiment of the present disclosure.
Figure 9:
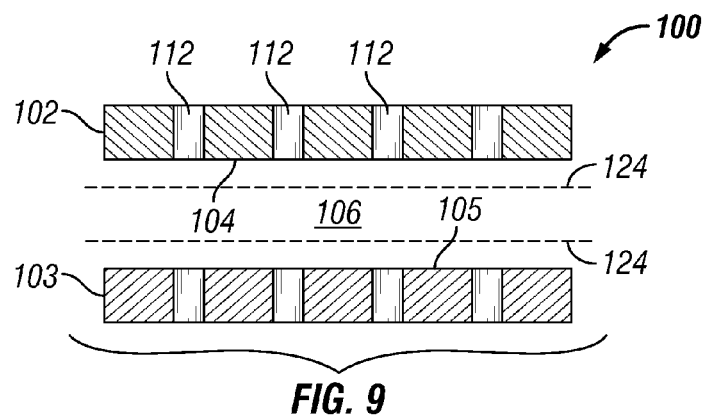
FIG. 9 shows a schematic representation, in cross section, of the ion source of FIG. 8, in accordance with one embodiment of the present disclosure.

In the embodiments shown in FIGS. 7, 8 and 9, the grid 124 extends along the interior surfaces 104 of the substrates. In the embodiments of FIGS. 1, 2, 3, 4, 5 and 6, the grids 124 also extend along the interior surfaces 104 of the substrates so that they are concentric within the tubular structures of the substrates. The distance between the grid 124 and the substrate 102 is defined as the gap distance (G). In illustrative embodiments, the gap distance (G) is in the range of 10 μm to 5 mm.

As shown in FIG. 2, the substrate 102 and the grid 104 are disposed within a housing 128. The housing 128 is configured to contain a gas or gas mixture such as hydrogen (e.g., deuterium ($^2H_1$), tritium ($^3H_1$) and/or other hydrogen isotopes). Furthermore, in various embodiments, the housing 128 is configured to contain the gas at low pressures. In one embodiment, the pressure within the housing is $10^{-3}$ torr. In various other embodiments, the pressures within the housing can range between $10^{-6}$ torr and 1 torr.

In various embodiments, as shown in FIG. 1, the ion source 100 also includes a control circuit 130 that is coupled to the grid 124 and the substrate 102. The control circuit 130 is configured to apply an electrical potential between the grid 124 and the substrate 102. When such a potential is applied, the nano-tips 116 within the channels 112 function to ionize the gas that is contained within the housing 128.

Figure 10:
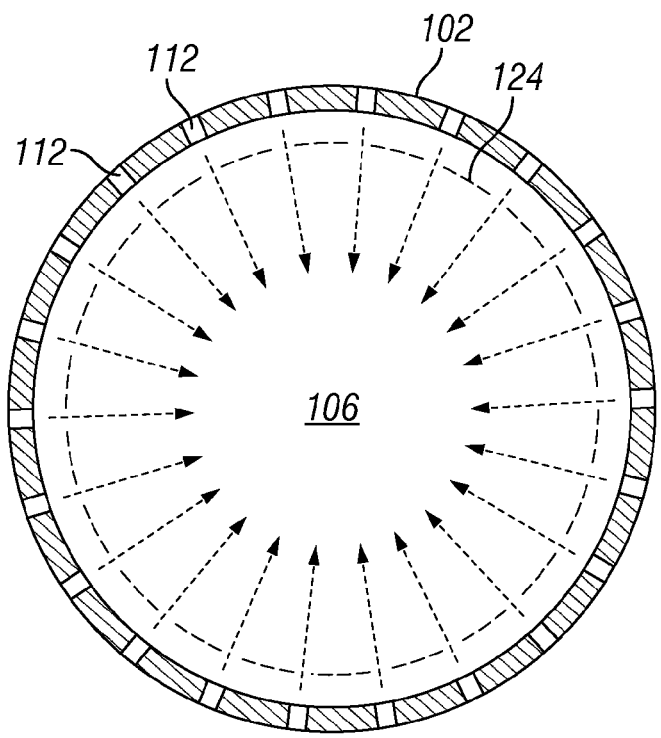
FIGS. 10-11 show a schematic representation, in cross section of an ion source in accordance with one embodiment of the present disclosure.
Figure 11:
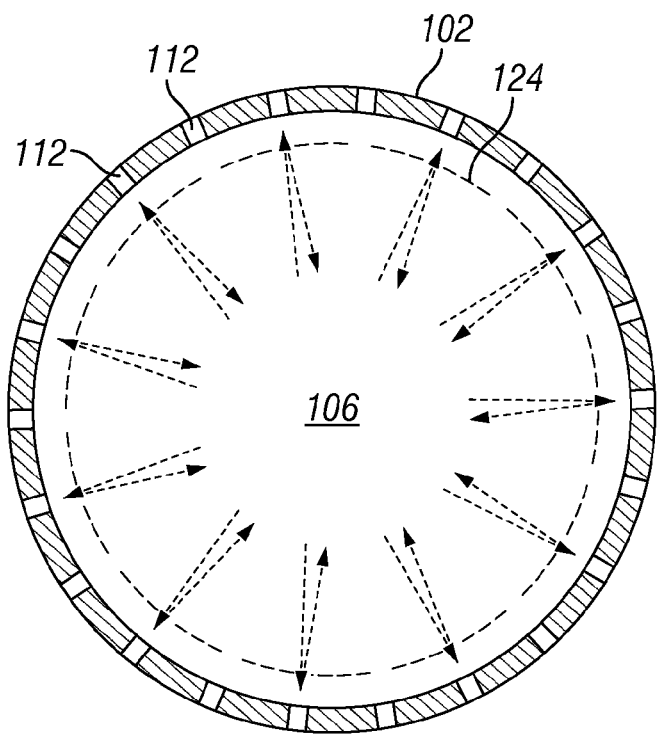

The control circuit 130 may be configured to operate in one of two different modes. FIGS. 10 and 11 show an example of an emission mode of operation. In this example, the substrate 102 is set to a negative potential and the grid 124 is set to a positive potential. In one such specific embodiment, the gap distance (G) is approximately 200 μm and an electric field gradient of 1-10 MV/m is generated using a low voltage, such as from a 100 V to a 5 kV. In such an arrangement, the field is enhanced (e.g., by a factor of 100 to 5000) near each nano-tip. Due to the enhanced field, the nano-tips 116 emit electrons, which are accelerated into the interior volume 106 of the ion source, as shown in FIG. 10. Depending on the size and number of channels 112, the arrangement can generate over 100 mA of electrons. Various embodiments of the present invention are not limited to these parameters. For example, in further illustrative embodiments, the gap distance (G) is in the range of 10 μm-5 mm, the electric field gradient is in the range of 1 MV/m-10 MV/m, and the electron current generated is in the range of 1 mA-500 mA.

Within the interior volume 106, the electrons interact with the gas to form ions. In the case of hydrogen gas (e.g., deuterium ($^2H_1$), tritium ($^3H_1$), and/or other isotopes), the following reactions may occur:

$$e + H_2 \rightarrow H_2^+ + 2e \quad (1)$$

$$e + H_2 \rightarrow H_1^+ + H_1^+ + 3e \quad (2)$$

In this manner, the ion source 100 generates positive gaseous hydrogen ions using the emission mode. An additional advantage of the emission mode of operation is that the grid 124 is set to a positive potential. As shown in FIG. 11, such an arrangement reflects electrons back into the interior volume 106 so that they can be "recycled" for the purposes of ionization. This benefit is compounded in low pressure systems where the probability of an electron interacting with a gas molecule is less likely.

The other mode of operation is a reverse mode. In reverse mode, the substrate 102 is set to a positive potential and/or the grid 124 is set to a negative potential. Under such an arrangement, the nano-tips 116 attract electrons and create gaseous ions through "field-induced ionization." In the case of hydrogen gas molecules (e.g., deuterium ($^2H_1$) and/or tritium ($^3H_1$)), the nano-tips 116 can dissociate the molecules and extract electrons from the molecules to form $H_2^+$ and $H_1^+$ ions. Various embodiments of reverse mode generate a higher fraction of atomic ions (e.g., $H_1^+$) in comparison with a conventional ion source. With respect to hydrogen gas, potentially up to 30-50% of the ions generated in reverse mode are $H_1^+$ ions. This higher fraction of atomic ions has the potential to effectively "double" resulting ion beam energy. For example, in a 100 kV HV acceleration system, $^2H_1^+$ ions achieve an energy of 100 keV, whereas $^2H_2^+$ ions achieve an energy of 50 keV. The doubling of energies for $^2H_1^+$ ions can increase neutron yield in a neutron generator by an order of magnitude due to the energy dependence of the fusion reaction's cross-section.

In reverse mode, ionization of the gas at (or near) a nano-tip 116 occurs when the electric field gradient between the respective nano-tip 116 and the grid 124 is sufficiently strong. When a gas molecule moves into the region of the high electric field gradient, an electron may tunnel from the molecule to the nano-tip 116 where it is transported through the nano-tip, into the substrate 102, and then into the control circuitry 130. Once the gas molecule is ionized, the negative potential of the grid 124 accelerates the ion into the interior volume 106.

In reverse mode, ionization is a function of (1) gas pressure, (2) magnitude of the electric voltage applied between the nano-tips 116 and the grid 124, (3) gap distance (G) between the nano-tips and the grid, and (4) the number of nano-tips. In one specific embodiment, the gas pressure is on the order of $10^{-3}$ torr, the gap distance (G) is set to less than 500 μm, the electric voltage applied is on the order of a 5 kV and the number of nano-tips is between $10^8$ and $10^9$. In some cases, an arrangement that uses 0.1 pA/nano-tip produces more than 100 μA to of ion current.

Various embodiments of the present invention are not limited to these parameters. For example, in further illustrative embodiments, the gas pressure is in the range of $10^{-6}$ torr-1 torr, the electric field gradient is in the range of 1 MV/m-10 MV/m, the gap distance (G) is in the range of 10 μm-5000 μm, the number of nano-tips 116 is in the range of $10^7$-$10^{11}$, and the ion current generated is in the range of 10 μA-1000 μA.

An important variable in reverse mode is the number of nano-tips 116 available for ionization and the spacing between those nano-tips. Field ionization uses a strong electrical field. In many cases, such strong fields are confined to a small volume adjacent each nano-tip (e.g., a volume defined by 30 nm diameter from a nano-tip). Given this small volume, there are few gas molecules available for ionization at low pressures (e.g., a $10^{-3}$ torr or less). If the gas pressure is increased, resulting ion and gas collisions may effectively reduce ion beam energy, thereby, nullifying any gain from the pressure increase. Also, to maintain efficient ionization, specific embodiments of the present invention use a spacing of approximately one nano-tip per μm$^2$. In various other embodiments, the spacing between nano-tips ranges between 0.1 μm-10 μm. Using such spacing, illustrative embodiments of the present invention advantageously increase the surface area available for location of nano-tips 116 and also increase the number of nano-tips within each ion source 100. Similarly, in the emission mode, an increased number of nano-tips can lower emission current per tip, which prevents thermal related degradation and extends the lifetime of nano-tips.

Furthermore, in both emission mode and reverse mode, various embodiments of the ion source 100 advantageously contain ions within the interior volume because the interior surface 104 of the substrate 102 confines the interior volume 106 in at least two different planes. Accordingly, illustrative embodiments of the present invention more efficiently contain ions than a substrate with an entirely flat surface.

Experimental results indicate that illustrative embodiments of the present invention potentially have extended lifetimes because the nano-tips 116 are protected from ion bombardment. Ion bombardment occurs when the charged substrate 102 and grid 124 causes ions to back-stream from the interior volume 106 and collide with nano-tips 116. These collisions can damage the nano-tips 116 and reduce the lifetime of the ion source 100. Illustrative embodiments of the present invention advantageously prevent such collisions. As shown in FIG. 3, the nano-tips 116 are disposed on the walls 114 of the channels 112. Ions that back-stream towards the substrate 102 will likely collide with the interior surface 104 of the substrate and avoid the nano-tips 116 within the channels 112. The location of the nano-tips 116 within the channels 112 protects them from ion bombardment.

Figure 12A:
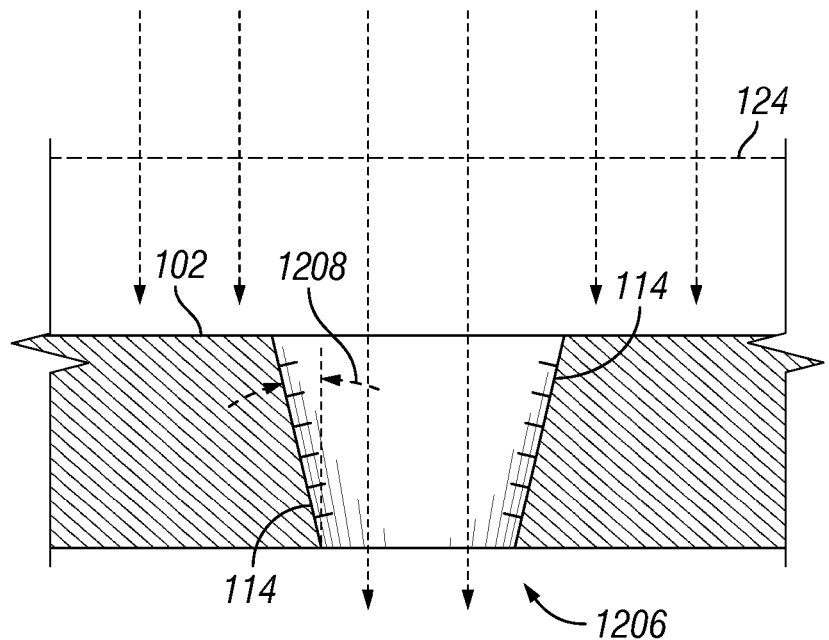
FIG. 12 shows a schematic representation, in detail, of a channel in accordance with one embodiment of the present disclosure.
Figure 12B:
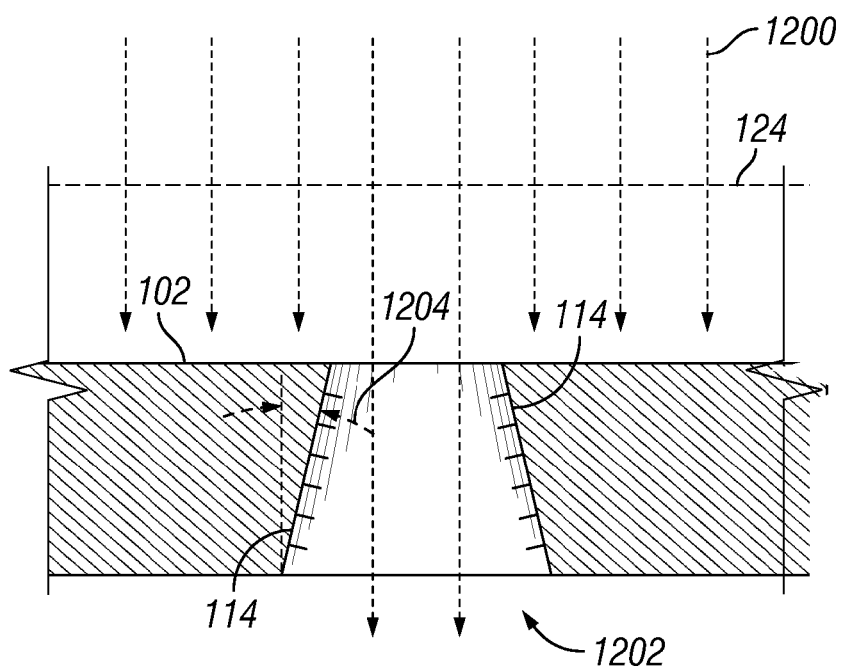

FIG. 12 shows another example of a substrate 102 that prevents ion bombardment of nano-tips. In FIG. 12, arrows 1200 designate the direction of ion bombardment. The substrate 102 includes a first channel 1202 with each of wall 114 of the first channel disposed at a gradient 1204 (e.g., 0-5 degrees). Most ions that enter the first channels 1202 pass through the channel without striking the nano-tips 116. In this manner, the gradient 1204 further enhances protection of the nano-tips 116 from ion bombardment and increases the lifetime of the ion source. Various embodiments of the ion source 100 have extended lifetimes over 1000 hours. The gradient 1204 and the substrate 102 are not shown to scale in FIG. 12.

In some cases, as the gradient angle 1204 is increased (e.g., over 5 degrees), the gradient generates a field shielding effect, which could adversely affect electron emission. To overcome the field shielding effect, a greater potential could be applied to the grid 124 and/or the gradient angle 1202 could be reduced.

In another illustrative embodiment, the substrate 102 includes a channel 1206 with each wall 114 of the channel disposed at a negative gradient 1208 (e.g., 0-5 degrees). In some cases, such a negative gradient configuration can help enhance the field within the channel and facilitate electron emission.

Furthermore, illustrative embodiments of the present invention use power more efficiently than conventional hot cathodes. Conventional hot cathodes operate at very high temperatures and have high power requirements for heating cathode materials. In contrast, illustrative embodiments of the present invention operate with field emission or ionization within a wide range of temperatures (e.g., ambient temperature) and avoid consuming the high power used to heat cathode materials. Various embodiments of the present invention use less than 1 Watt of power to generate the electrical potential between the grid 124 and the substrate 102.

Also, in contrast to hot cathodes, various embodiments of the present invention use space more efficiently than conventional cathodes. Due to high operating temperatures, location of the hot cathode within the ion source is limited because components within the ion source are temperature sensitive. In contrast, specific embodiments of the present invention operate at low temperatures and, for this reason, the substrate and grid configuration can be placed flexibly over many regions of the ion source 100. This significantly simplifies the packaging of the ion source 100 and facilitates "optical" control of ions within the ion source. A simple packaging is particularly beneficial in downhole tool applications because available space on downhole tools is scarce.

Illustrative embodiments of the present invention also efficiently generate ions using a small package size. Various embodiments of the present invention have a package size of between 1 cm-5 cm in length and 1 cm-5 cm in diameter (e.g., as applied to a cylindrical embodiment as shown in FIG. 1). The amount of ions generated is largely a function of the number of nano-tips 116 and the surface area available to locate the nano-tips. Using a single flat substrate, the surface area available for locating nano-tips is defined by the following equation:

$$\text{Area} = L_S \times W_S \quad (3)$$

where $L_S$ is the length of the substrate and $W_S$ is the width of the substrate. Thus, the area available is constrained by two dimensions (e.g., $L_S$ and $W_S$). To increase the surface area available for locating nano-tips, the length and/or the width of the substrate can be increased. This increase in area unfavorably increases the package size of the ion source.

By using channels 112, various embodiments of the present invention increase the surface area available for locating nano-tips. Using a circular channel 112 (as shown in FIGS. 1-3), the surface area available for locating nano-tips 116 is defined by the following equation:

$$\text{Area} = T_C \times \pi D_C \quad (4)$$

where $T_C$ is the depth of the channel and $D_C$ is the diameter of the channel. In this case, the available area is no longer just a function of the surface area of the substrate 102, but now also depends on a third dimension, namely, the depth of the channel 112 within the substrate.

The surface area available for locating the nano-tips 116 can be further increased by using a plurality of channels 112. Using a plurality of channels 112 (as shown in FIGS. 1-3), the surface area available for locating nano-tips 116 is defined by the following equation:

$$\text{Area} = N_C \times T_C \times \pi D_C \quad (5)$$

where $N_C$ is the number of channels within the substrate 102. The number of channels 112 is another variable that multiples the surface area available for locating nano-tips 116. In FIGS. 1-3, the specific embodiment shown includes forty-eight channels 112; however, in other embodiments of the invention, the ion source 100 includes hundreds or thousands of channels. In various embodiments of the present invention, the surface area available for locating channels 112 ranges between 1 cm$^2$-10 cm$^2$. In some cases, the surface area available for locating channels 112 is greater than 10 cm$^2$. Depending on the arrangement and the size of the channels 112, the number of nano-tips 116 can be within the range of $10^8$-$10^{11}$.

Furthermore, instead of using a single flat substrate to locate the channels, illustrative embodiments of the present invention use a substrate 102 with an interior surface 104 that at least partially defines an interior volume 106 (e.g., as shown in FIGS. 1-9). Such substrates 102 increase the surface area available to locate the channels 112 and, in this manner, also enhance the surface area available for locating the nano-tips 116. For example, the area available to locate channels 112 using a single flat substrate is defined by equation 3. In contrast, for the embodiment of FIG. 1-3, the area available to locate channels 112 is defined by the following equation:

$$\text{Area} = L_S \times \pi D_S \quad (6)$$

where $D_S$ is the diameter of the cylindrical substrate 102 and $L_S$ is the length of the substrate. Using such an arrangement, a greater area is available to locate channels 112, while the total package size of ion source 100 remains constant or is reduced.

Figure 13:
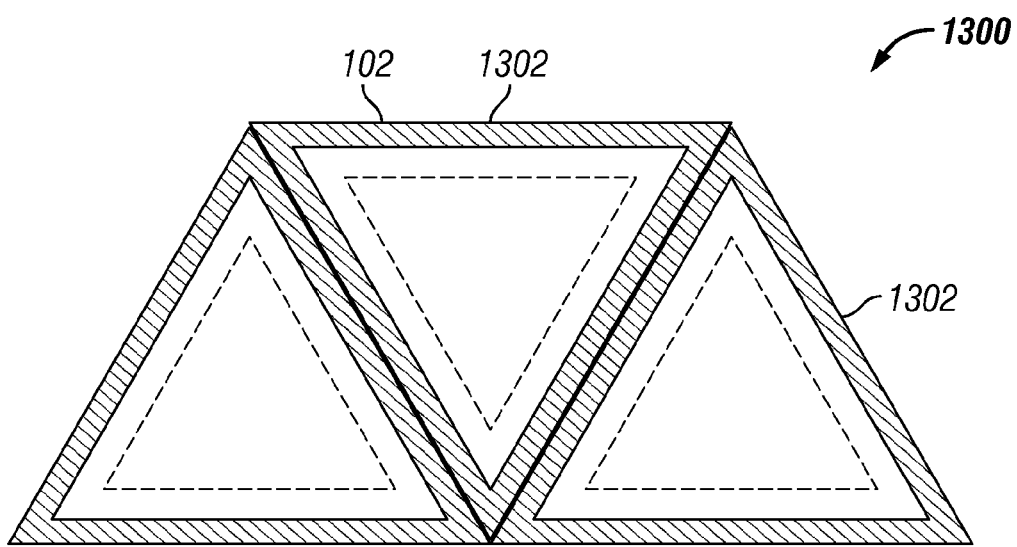
FIG. 13 shows a schematic representation of an ion source with multiple ion source structures in accordance with one embodiment of the present disclosure.
Figure 14:
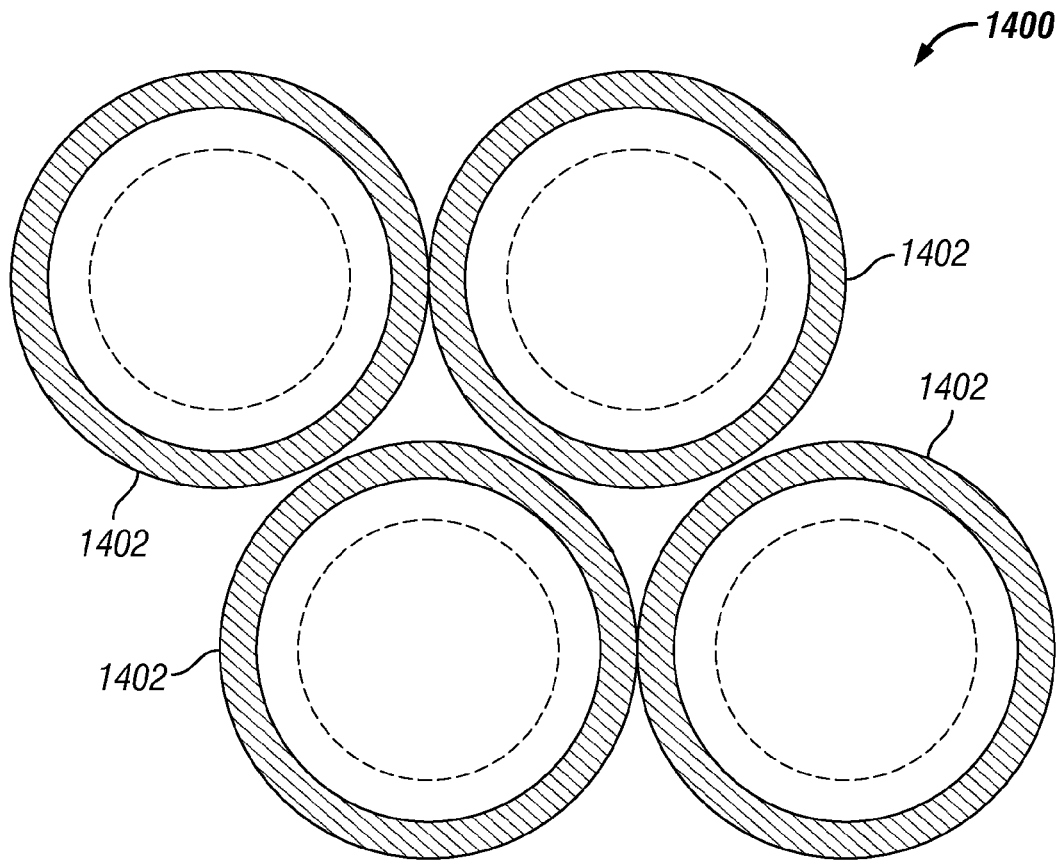
FIG. 14 shows a schematic representation of an ion source with multiple ion source structures in accordance with another embodiment of the present disclosure.
Figure 15:
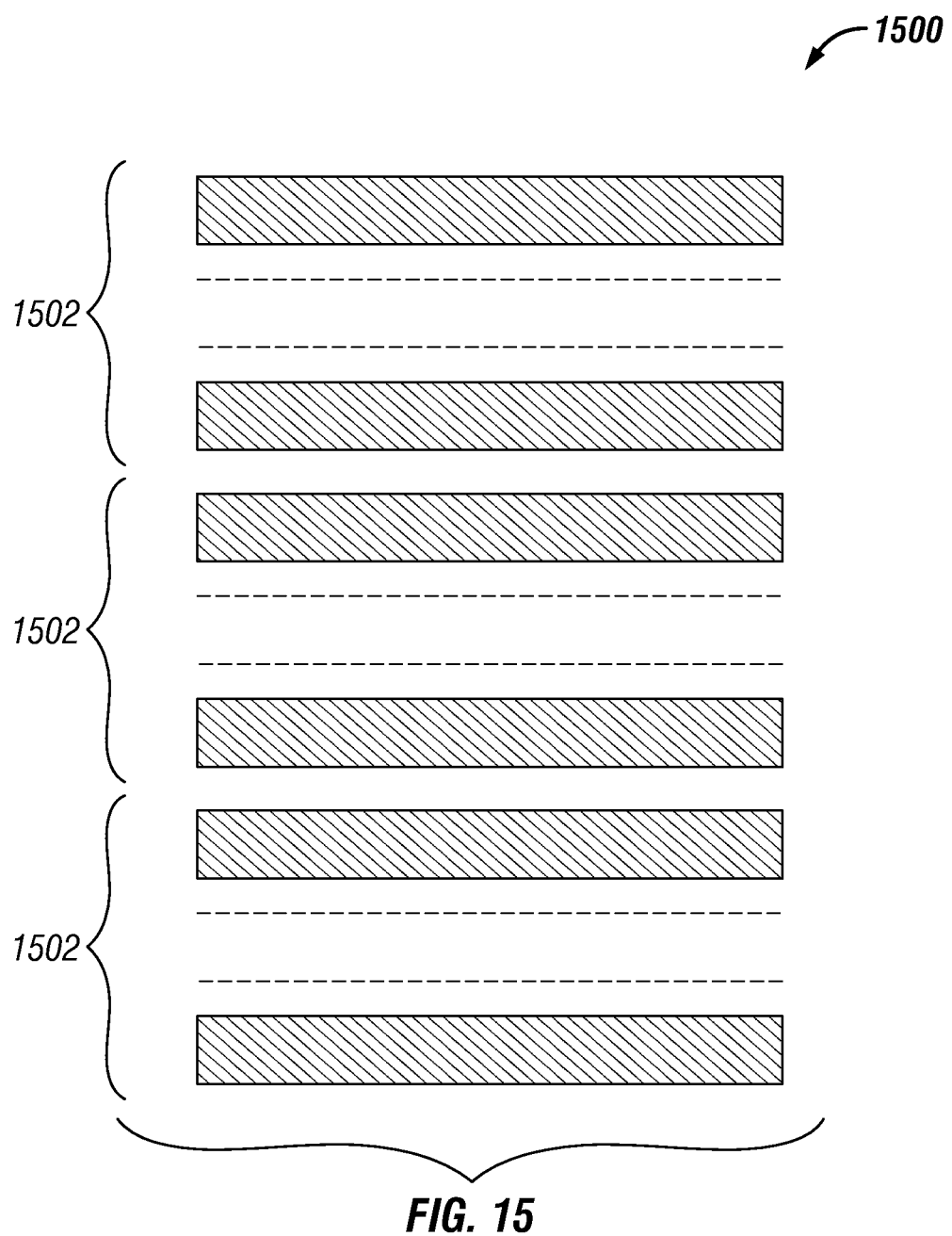
FIG. 15 shows a schematic representation of an ion source with multiple ion source structures in accordance with yet another embodiment of the present disclosure.

In yet another illustrative embodiment, the surface area available for locating the nano-tips 116 can be further increased by using a plurality of ion source structures. For example, FIG. 13 shows an example of a "honeycomb" structure 1300 where three triangular ion source structures 1302 (as shown in FIG. 5) are combined. This configuration provides three times the ions of a single triangular structure. FIG. 14 shows another example of a honeycomb structure 1400 where four cylindrical ion source structures 1402 (as shown in FIG. 1) are combined. In another example, FIG. 15 shows a stacked configuration 1500, where three ion source structures 1502 (as shown in FIGS. 8-9) are stacked side-by-side and, in this manner, multiply output of ions. The following equation defines the surface area available for locating nano-tips using a plurality of ion source structures:

$$\text{Area} = S \times N_C \times T_C \times \pi D_C \quad (7)$$

where S is the number of ion source structures. Using any of the above described techniques, the surface area available for locating nano-tips 116 is increased while the package size of the ion source 100 can remain constant or be further reduced.

Figure 16:
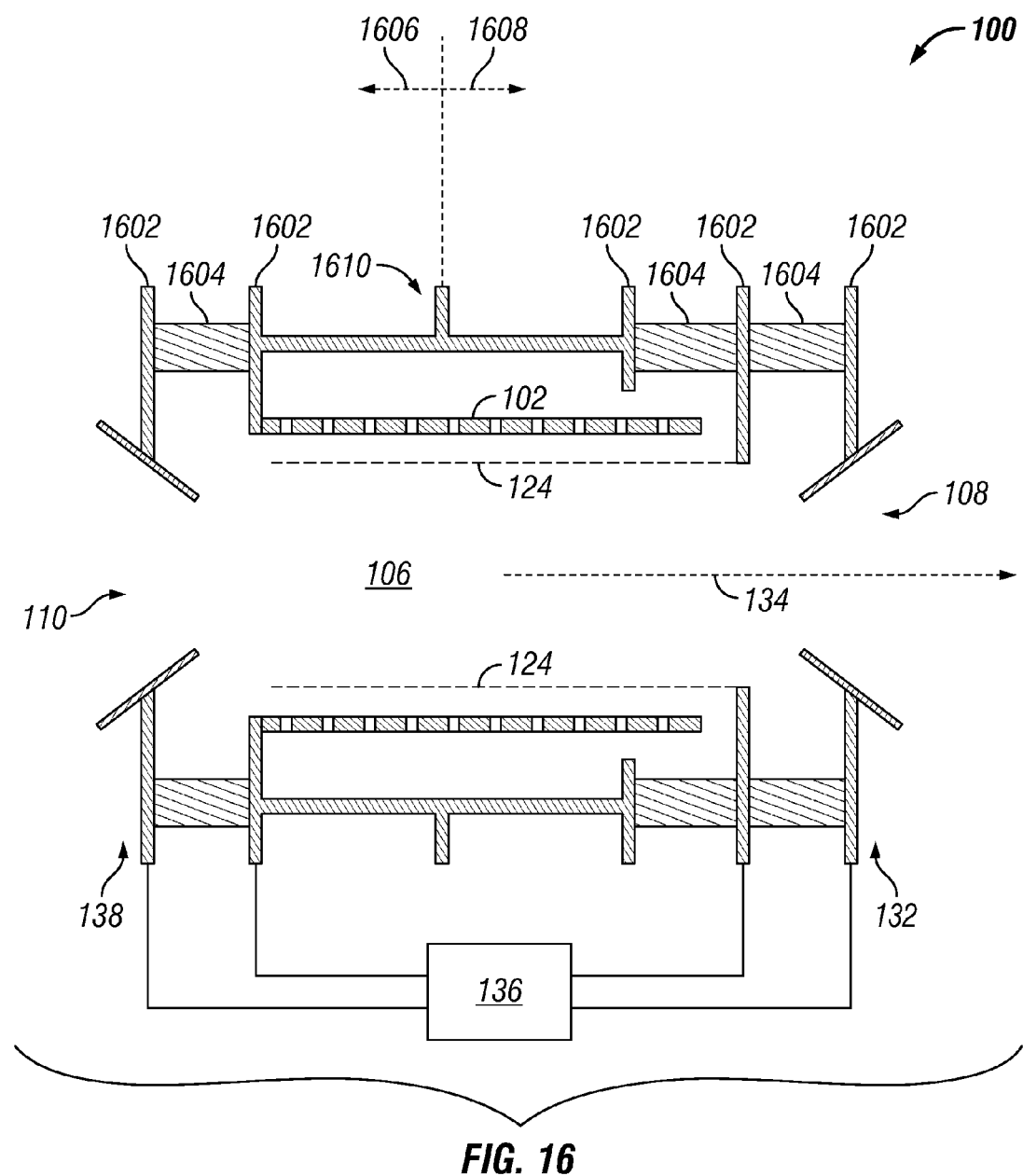
FIG. 16 shows a schematic representation, in cross section, of an ion source in accordance with one embodiment of the present disclosure.

Illustrative embodiments of the present invention also include an extractor for extracting ions from the interior volume of the ion source. FIG. 16 shows an example of an ion source 100 with an extractor 132 in accordance with one embodiment of the present invention. The extractor 132 is configured to create an electrical potential that extracts at least a portion of ions within the interior volume 106. To this end, in specific examples, the extractor 132 is an electrode, a plate and/or a grid that is positioned adjacent to the interior volume 106 of the ion source 100. In FIG. 16, the extractor 132 is located adjacent to the first opening 108 of the substrate 102. In the case of positive hydrogen ions, when the extractor 132 is set to a negative potential, the extractor creates an ion beam 134 that exits the ion source 100. In various specific embodiments, the potential is negative in a range between 5V-5 kV. In some embodiments, the extractor 132 and the grid 124 are controlled by a control circuit 136 that operates in a pulse mode. In other words, the circuit 136 intermittently applies a negative potential to the extractor 132 and/or a corresponding positive potential to the grid 124 (as in the emission mode) in order to create a pulsed ion beam 134.

In further illustrative embodiments, the extractor 132 may also work in concert with a pusher 138. The pusher 138 is configured to create an electrical potential that pushes at least a portion of ions within the interior volume 106. In specific examples, the pusher 138 is an electrode, a plate, and/or a grid that is positioned adjacent to the interior volume 106 of the ion source 100. In FIG. 16, the pusher 136 is located adjacent to the second opening 110 of the substrate 102 and is positioned on the opposite side of the interior volume 106 from the extractor 132. In the case of positive hydrogen ions, when the pusher 136 is set to a positive potential, the pusher 138 creates an ion beam 134 that exits the ion source. In various specific embodiments, the potential is positive in a range of 5V-5 kV. In various embodiments of the present invention, the extractor 132 and pusher 138 work in concert to create the ion beam 134. To this end, the control circuit 136 simultaneously applies a negative potential to the extractor 132 and a positive potential to the pusher 138. The tandem "pushing" and "pulling" work together for efficient ion extraction from the interior volume 106 and, in this manner, generate well-defined ion beam pulses 134. Also, the tandem "pushing" and "pulling" provides a flexible control mechanism for modulating the "optics" of the ion beam 134.

Furthermore, during the time intervals when the circuit is not generating a pulse (e.g., idle time), the pusher 138 and the extractor 132 can be set to a neutral potential or to a slightly positive potential (e.g., 5V-5 kV). A slightly positive potential on the extractor 132 helps prevent the escape of positive ions from the interior volume 106 towards the target direction during idle time. In another embodiment, the pusher 138 and extractor 132 both reverse their potentials during idle time (e.g., reverse "pushing" and "pulling"). Such tandem "pushing" and "pulling" and tandem reverse "pushing" and "pulling" can generate well-defined "square"-shaped ion pulses. Such square-shaped pulses limit the amount of background ions beam present between pulses. With square-shaped ion beams striking the target, the neutron pulses generated by the target are also square-shaped. This characteristic is advantageous for applications where sharp neutron pulse timing and pulse cut-off facilitate obtaining "clean" data from neutron scattering and reactions.

Figure 17:
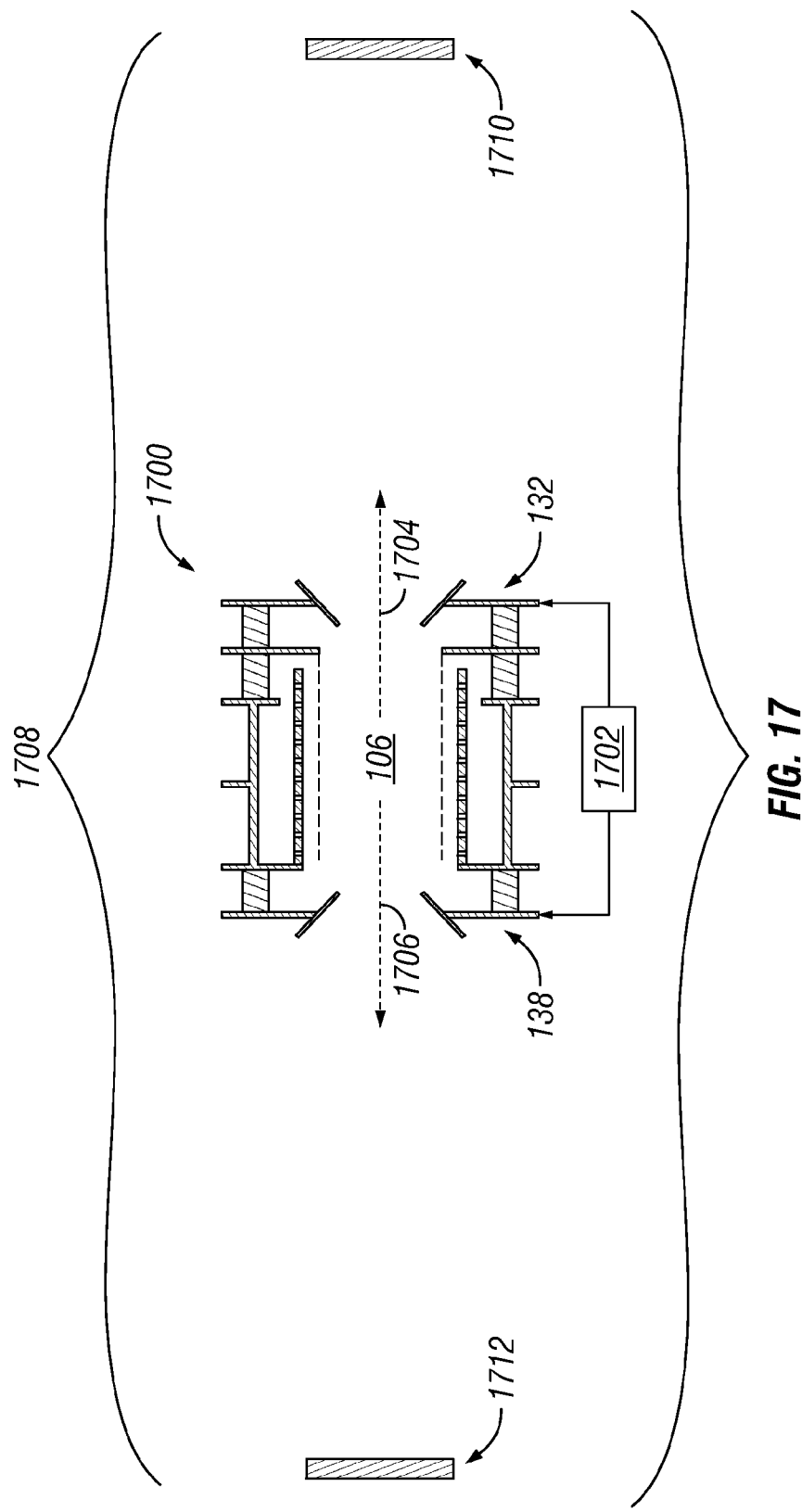
FIG. 17 shows a schematic representation, in cross section, of an ion source in accordance with another embodiment of the present disclosure.

FIG. 17 shows an example of a bi-directional ion source 1700 in accordance with one embodiment of the present invention. In this example, the extractor 132 and the pusher 138 are controlled by a control circuit 140 that is configured to set each of the extractor and the pusher to a positive potential and a negative potential. In other words, the extractor 132 is configured to operate as both an extractor and a pusher, and the pusher 138 is configured to operate as both an extractor and a pusher. In this manner, the bi-directional ion source 1700 can operate to emit ion beams 142, 144 from the first opening or the second opening. In one specific embodiment, the bi-directional ion source 1700 is used in a duel target neutron generator 1708. As shown in FIG. 17, in a duel target neutron generator, a first target 1710 and a second target 1712 are spaced from the ion source 1700. In a first mode of operation, the extractor 132 is set to a negative potential and the pusher 138 is set to a positive potential. In this mode of operation, the ion beam 1704 exits a first opening and strikes the first target 1710. In the second mode of operation, the extractor 132 is set to a positive potential and the pusher 138 is set to a negative potential. In the second mode, the ion beam 1706 exits the second opening and strikes the second target 1712.

Illustrative embodiments of the present invention provide for improved ion control over conventional cathodes. For example, various embodiments of the invention shown in FIGS. 1-9 allow pushers 138 and extractors 132 to be positioned in a variety of different locations adjacent to the interior volume 106. The pushers 138 and extractors 132 can operate in concert to propel the ions within the interior volume 106. Such an arrangement is advantageous over conventional cathode arrangements where the extraction electrode is located on only one side of the ion source. At the same time, in various embodiments of the present invention, ion escape is restricted because the substrate 102 and the grid 124 concentrate the ions within the interior volume 106.

Illustrative embodiments of the present invention are also directed to methods and processes for fabricating the above described ion source. The various embodiments of the substrate 102 can be formed from metals, such as copper, aluminum or molybdenum.

In other embodiments, the substrate 102 is formed from a semiconducting material, such as silicon or germanium. The channels 112 are formed within the substrate 102 using mechanical processing, such as drilling and punching. In various other embodiments, the channels 112 are formed using a chemical process, such as chemical etching. In yet other embodiments, the channels 112 are formed using other manufacturing processes, such as laser or diamond cutting.

In one embodiment, the nano-tips 116 are carbon nanotubes. The carbon nanotubes may comprise single-walled carbon nanotubes, multi-walled carbon nanotubes, or a combination of the two. A single-wall carbon nanotube ("CNT") is a cylindrical structure with a diameter on the order of 5 nanometers and an annular side-wall made from a sheet of graphite (called a "graphene"). A multi-walled carbon nanotube ("MWNT") includes multiple layers of graphite that form a tube shape. In one exemplary embodiment, the carbon nanotubes are deposited on the channel walls by a chemical vapor deposition process. To this end, catalyst nanoparticles are placed at defined surface sites within the channels 112 and then heated at high temperatures in a reactor with flowing hydrocarbon gases. Carbon nanotubes grow from the catalyst particles via catalytic dissociation of the hydrocarbon molecules and the catalyst particles, and dissolution of carbon atoms into the particles. Upon saturation, carbon atoms precipitate from the catalyst particles to thereby form the tubular carbon structure. In one specific embodiment, a central axis of the carbon nanotubes is oriented substantially transverse to the walls 114 of the channel 112. Furthermore, in another specific example, the carbon nanotubes include about $10^6$ carbon nanotubes per $cm^2$.

Illustrative embodiments of the present invention are not limited to single and multi-wall carbon nanotubes. In various embodiments, the nano-tips 116 can be any one or more of the structures selected from the following non-limiting list:

Staged nano-tubes on top of MWNTs,

Various shaped nano-wires,

Nano-structures sometimes referred to as nano-grass,

Micro-machined or chemically etched micro-tips formed from semiconductor materials, such as silicon, germanium, or wide-band gap materials such as diamond (including materials with metal coatings to enhance their conductivity).

Micro-tips attached with natural formed structures such as diamondoids,

Spindt arrays, or

Any field emitting array (FEA).

Also, in various embodiments, the nano-tips can be highly ordered (e.g., using diamond micro-tips). In other embodiments, the nano-tips are less ordered (e.g., using carbon nano-tubes). Furthermore, the term "nano-tips" should not be interpreted as limited to structures with dimensions on a "nano" scale.

In illustrative embodiments, the ions source 100 can be assembled using a plurality of components. In one specific embodiment, as shown in FIG. 16, the ion source 100 is assembled using a plurality of flanges 1602 and spacers 1604. The spacers 1604 are made from an insulating material (e.g., an alumina ceramic or glass material), and the flanges 1602 are made from a conductive material (e.g., a metal material). In FIG. 16, the flanges 1602 are used to mount the components of the ion source 100 (e.g., the substrate 102, the grid 124, the extractor 132, and the pusher 138). The flanges 1602 are also used to electrically couple the components to the control circuit 136. The spacers 1604 are mounted between the flanges 1602 to insulate the components from each other. In this manner, the control circuit 136 can apply different electrical potentials to each of the components without crosstalk. In one embodiment, the spacers 1604 and the flanges 1602 are coupled using a brazing process.

The high temperatures from the brazing process may damage the substrate 102, specifically, the nano-tips 116 within the channels 112. In accordance with various embodiments of the present invention, to preserve the substrate 102, high temperature processes, such as brazing, are performed before the substrate is mounted within the ion source 100. In one specific embodiment, as shown in FIG. 16, brazing is performed to assemble a substrate assembly 1606 and a grid assembly 1608. After the brazing is completed, the substrate 102 is coupled to the substrate assembly 1606 using a localized heating process, such as a welding process. The substrate assembly 1606 and the grid assembly 1608 are then coupled at a joint 1610 using the localized heating process. The localized heating process protects the nano-tips 116 within the substrate 102 from high temperatures.

Figure 18:
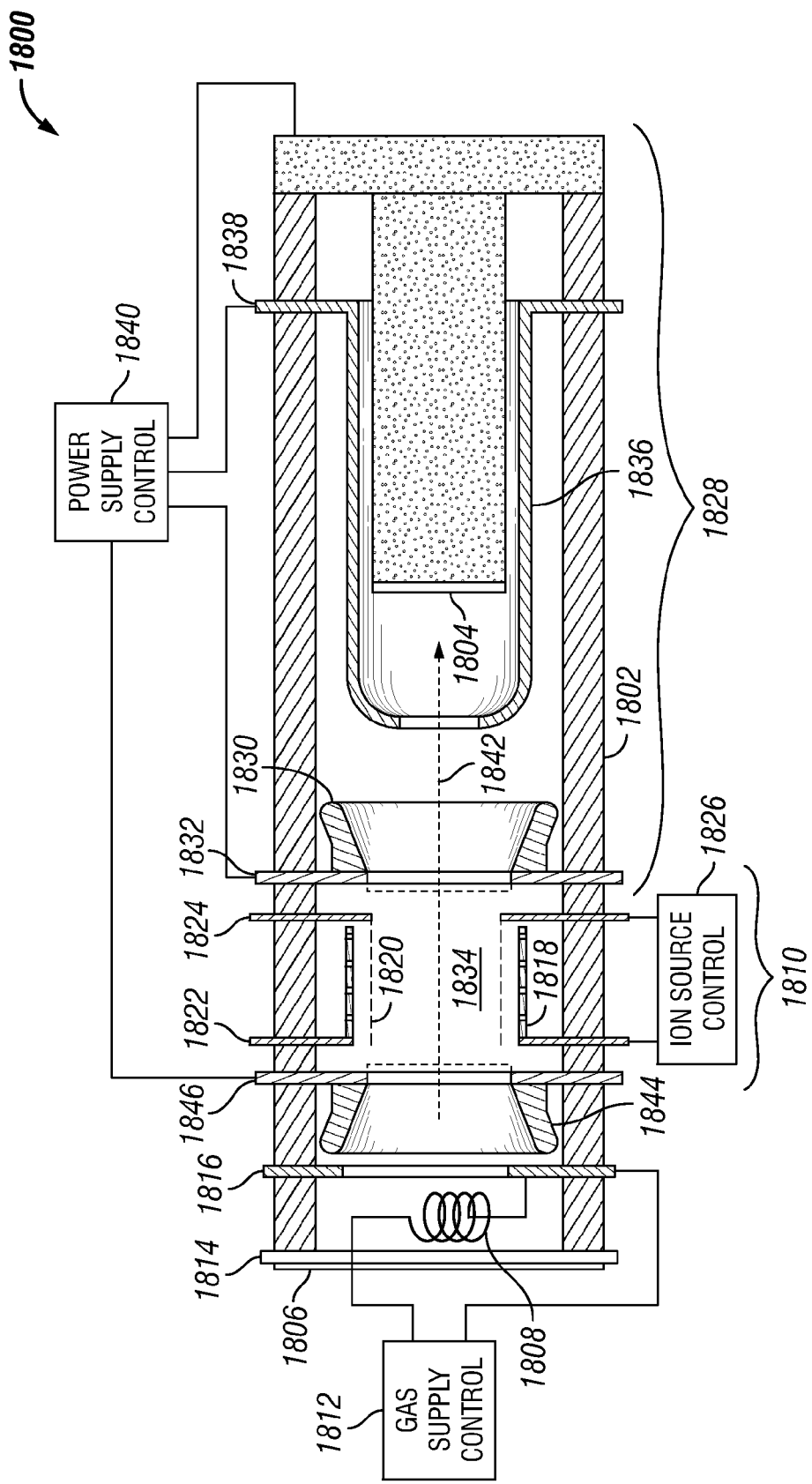
FIG. 18 shows a schematic representation, in cross section, of a neutron generator in accordance with one embodiment of the present disclosure.

Illustrative embodiments of the present invention are also directed to neutron generators. FIG. 18 shows a schematic representation of a neutron generator 1800 in accordance with one embodiment of the present invention. In the specific embodiment of FIG. 18, the neutron generator 1800 includes a housing 1802 in the shape of a hollow cylindrical tube. The housing 1802 is made of an insulating material, such as alumina ceramic or glass. In one specific embodiment, the size of the housing is minimized so that the neutron generator 1800 can be efficiently placed within a downhole tool. In one such embodiment, the diameter of the housing 1800 is approximately 2 cm-5 cm and the length of the housing is approximately 15 cm-16 cm. In various other embodiments, however, the size of the housing 1800 can range between 1 cm-10 cm in diameter and 5 cm-30 cm in length.

A target 1804 is disposed at one end of the housing 1802 and a header 1806 is used to cap the other end of the housing. This arrangement provides a gas-tight cylindrical envelope inside the housing 1802. A gas supply 1808 is disposed between the header 1806 and an ion source 1810. In one embodiment, the gas supply 1808 includes a helically wound filament of metal (such as tungsten) coated with a metal hydride film (such as a hydride of titanium, scandium, and/or zirconium). The filament is connected to the gas supply control circuitry 1812 via a first conductive flange 1814 and a second conductive flange 1816. The gas supply control circuitry 1812 passes current to the filament and, as a result, heats the filament and the metal hydride film. At elevated temperatures in a range of 250° C.-550° C. (e.g., 400° C.), the hydride film emits deuterium ($^2H_1$) and/or tritium ($^3H_1$) in gaseous form. The deuterium ($^2H_1$) and/or tritium ($^3H_1$) gas molecules then diffuse into the ion source 1810.

The ion source 1810 corresponds to any one or more of the ion sources described in FIGS. 1-17 of the present application. The ion source 1810 includes a substrate 1818 and a grid 1820. The substrate 1818 and the grid 1820 are supported within the housing 1802 using a third conductive flange 1822 and a fourth conductive flange 1824. The third conductive flange 1822 and the fourth conductive flange 1824 also electrically couple the substrate 1818 and the grid 1820 to the ion source control circuitry 1826. During operation of the neutron generator 1800, the gasses emitted by the gas supply 1808 diffuse into the ion source 1810. The ion source control circuitry 1826 operates the ion source in either an emission mode or a reverse mode of operation. In either case, the deuterium ($^2H_1$) and/or tritium ($^3H_1$) gas molecules are ionized by the ion source 1810. The ionized gas (e.g., molecular ions and/or atomic ions) is extracted by the extractor 1830 (e.g., or a combination of the extractor 1830 and the pusher 1844) from an interior volume 1834 to form an ion beam 1842 that moves into an accelerator section 1828.

The accelerator section 1828 is configured to accelerate ions towards the target 1804. In the illustrative embodiment shown, accelerator section 1828 includes the extractor 1830 (e.g., as shown in FIG. 16) supported by and electrically connected to a fifth conductive flange 1832. The extractor 1830 is supplied with a negative voltage potential relative to the grid 1818 within the ion source 1810 (e.g., in the range of 5V-5 kV) in order to pull ions into the accelerator section 1828 from the interior volume 1834 of the ion source 1810.

The accelerator section 1828 also includes a suppressor 1836 supported by and electrically connected to a sixth conductive flange 1838. Power supply circuitry 1840 is electrically coupled to the extractor 1830 and the suppressor 1836 via the flanges 1832, 1838. The power supply circuitry 1840 is also coupled to the target 1804. During operation, the power supply circuitry 1840 provides a large positive voltage difference (e.g., in the range of 80 kV-180 kV) between the extractor 1830 and the suppressor 1836 in order to accelerate ions toward the target 1804 with sufficient energy to cause the bombarding ions to generate and emit neutrons from the target. The direction of the ion beam is designated by arrow 1842.

In one specific embodiment, the suppressor 1836 is a concave member partially surrounding the target 1804 with a central aperture that allows for ions to pass to the target. The suppressor 1836 acts to prevent electrons from being extracted from the target 1804 upon ion bombardment. These extracted electrons are commonly referred to as secondary electrons. To prevent electron extraction, the power supply circuitry 1828 supplies a negative voltage potential difference between the suppressor 1836 and the target 1804 (e.g., in the range 500V-2 kV).

In one specific embodiment, the target 1804 is composed of a metal hydride material. The target material also includes deuterium molecules, tritium molecules, or a mixture of the two. When the hydrogen ions strike the target 1804, the molecules react with one another to generate neutrons. The following reaction is an example of the reactions that occur:

$$^{2}H_1 + ^{3}H_1 \rightarrow ^{4}He_2 + ^{1}n_0 + 14.1 \text{ MeV} \quad (8)$$

Using the above described ion source and neutron generator, some embodiments of the present invention can produce neutron flux in the range of $10^6$-$10^{10}$ n/s.

In the specific embodiment of FIG. 18, the neutron generator 1800 also includes the pusher 1844 (e.g., as shown in FIG. 16). The pusher 1844 is supplied with a positive voltage potential relative to the grid 1820 within the ion source 1810 (e.g., in the range of 5V-5 kV) in order to push ions out of the interior volume 1834. The pusher 1844 is supported by and electrically connected to a seventh conductive flange 1846. In the embodiment of FIG. 18, the extractor is electrically coupled to the power supply circuitry 1840. During operation, the power supply circuitry 1840 may be configured to use the extractor 1830 and the pusher 1844 to extract the ions from the interior volume 1834 of the ion source 1810.

In other embodiments, the extractor 1830 and/or pusher 1844 are omitted. In some cases, a large positive voltage difference between the grid 1820 and the suppressor 1836 is used to accelerate ions toward the target 1804 with sufficient energy to cause the bombarding ions to generate and emit neutrons.

The ion sources and neutron generators described herein can be advantageously used in a variety of different oil and gas field tools for both downhole and surface environments. Illustrative embodiments of the present invention can be used in wire-line and logging-while-drilling tools for porosity analysis, gas detection, gas analysis, borehole salinity measurements, formation salinity measurements, specific element identification, mineral identification, reservoir saturation analysis, reservoir monitoring, mass spectroscopy and borehole fluid flow analysis. Examples of such logging tools and applications are described in U.S. Patent Publication No. 2009/0135982; and U.S. Pat. Nos. 4,794,792; 4,721,853; 4,600,838; and 5,313,504, which are herein incorporated by reference in their entireties.

Furthermore, illustrative embodiments of the present inventions are not limited to oil field and gas field specific applications. Various embodiments of the present invention may be used in a wide range of fields and applications. For example, various embodiments of the present invention may be used in field emission transistors, x-ray tubes, gas detectors, gas analyzers and/or mass-spectrometer. With respect to field emission transistors and X-ray tubes, such devices are generally not used as ion sources, but such devices can include nano-tips for emitting electrons. When operating in an electron emission mode, residual gas ions and/or secondary ions can back stream to damage nano-tips. Field emission transistors and X-ray tubes designed in accordance with various embodiments of the present invention can avoid damage to the nano-tips and prolong the lifetime of such devices.

Although the above discussion discloses various exemplary embodiments of the invention, it should be apparent that those skilled in the art can make various modifications that will achieve some of the advantages of the invention without departing from the true scope of the invention.

What is claimed is:

1. An ion source comprising:
   at least one substrate comprising a substrate surface that at least partially defines an interior volume;
   at least one channel comprising at least one channel wall, the at least one channel extending from the substrate surface into the at least one substrate;
   a plurality of nano-tips disposed on the at least one channel wall;
   a housing containing a gas, wherein the at least one substrate is disposed within the housing;
   a grid disposed in the internal volume; and
   at least one electrical control circuit configured to apply an electrical potential between the grid and the at least one substrate such that the applied electrical potential causes the plurality of nano-tips to ionize the gas,
   wherein the grid is spaced apart from the at least one substrate to allow for generated ions that back-stream toward the substrate to collide with the substrate surface and avoid the nano-tips.

2. The ion source of claim 1, wherein the substrate forms a tube with a first opening and a second opening and the grid is disposed within the interior volume of the tube.

3. The ion source of claim 2, wherein the tube is cylindrical and the grid is concentric within the tube.

4. The ion source of claim 2, wherein the tube includes at least three sides.

5. The ion source of claim 1, wherein the at least one substrate includes two substrates spaced apart from each other, the interior volume is defined between the two substrates, and the grid is disposed within the interior volume between the first substrate and the second substrate.

6. The ion source of claim 1, wherein the at least one electrical control circuit is configured to apply positive potential to the grid so that the plurality of emitters emit electrons for ionizing the gas.

7. The ion source of claim 1, wherein the at least one electrical control circuit is configured to apply a negative potential to the grid so that the plurality of emitters attract electrons and ionize the gas.

8. The ion source of claim 1, wherein the substrate includes a plurality of channels, each channel having at least one side wall, and each side wall including a plurality of nano-tips extending therefrom.

9. The ion source of claim 1, wherein the channels form through-holes through the substrate.

10. The ion source of claim 1, further comprising:
    an extractor disposed adjacent to the interior volume, the extractor configured to extract ions from the interior volume.

11. The ion source of claim 10, further comprising:
    a pusher disposed adjacent to the interior volume and opposite from the extractor, the pusher configured to push ions out of the interior volume.

12. A neutron generator comprising:
    an ion source including:
        at least one substrate comprising a substrate surface that at least partially defines an interior volume;
        at least one channel comprising at least one channel wall, the at least one channel extending from the substrate surface into the at least one substrate;
        a plurality of nano-tips disposed on the at least one channel wall; and
        a grid disposed in the internal volume;
    a target;
    an accelerator section configured to accelerate ions from the ion source towards the target and to strike the ions against the target to generate neutrons;

a housing for containing a gas, the ion source, the target, and the accelerator section being disposed within the housing; and at least one electrical control circuit configured to apply an electrical potential between the grid and the at least one substrate such that the applied electrical potential causes the plurality of nano-tips to ionize the gas to generate ions, wherein the grid is spaced apart from the at least one substrate to allow for generated ions that back-stream toward the substrate to collide with the substrate surface and avoid the nano-tips.

13. The neutron generator of claim 12, wherein the substrate forms a tube with a first opening and a second opening and the grid is disposed within the interior volume of the tube.

14. The neutron generator of claim 13, wherein the tube is cylindrical and the grid is concentric within the tube.

15. The neutron generator of claim 13, wherein the tube includes at least three sides.

16. The neutron generator of claim 12, wherein the at least one substrate includes two substrates spaced apart from each other, the interior volume is defined between the two substrates, and the grid is disposed within the interior volume between the first substrate and the second substrate.

17. The neutron generator of claim 12, wherein the channels form through-holes through the substrate.

* * * * *